(12) United States Patent
Lu et al.

(10) Patent No.: US 7,271,110 B2
(45) Date of Patent: Sep. 18, 2007

(54) HIGH DENSITY PLASMA AND BIAS RF POWER PROCESS TO MAKE STABLE FSG WITH LESS FREE F AND SIN WITH LESS H TO ENHANCE THE FSG/SIN INTEGRATION RELIABILITY

(75) Inventors: Wei Lu, Singapore (SG); Liang Choo Hsia, Singapore (SG)

(73) Assignee: Chartered Semiconductor Manufacturing, Ltd., Singapore (SG)

( * ) Notice: Subject to any disclaimer, the term of this patent is extended or adjusted under 35 U.S.C. 154(b) by 352 days.

(21) Appl. No.: 11/029,835

(22) Filed: Jan. 5, 2005

(65) Prior Publication Data

US 2006/0148270 A1 Jul. 6, 2006

(51) Int. Cl.
*H01L 21/31* (2006.01)
(52) U.S. Cl. .................. 438/763; 438/786; 438/788; 438/792
(58) Field of Classification Search .................. 438/763
See application file for complete search history.

(56) References Cited

U.S. PATENT DOCUMENTS 6,303,518 B1    10/2001  Tain et al.
6,323,119 B1    11/2001  Xi et al.
6,383,954 B1     5/2002  Wang et al.
6,410,457 B1 *   6/2002  M'Saad et al. ............. 438/778
6,468,927 B1    10/2002  Zhang et al.
6,489,230 B1    12/2002  Huang
6,511,922 B2     1/2003  Krishnaraj et al.
6,593,650 B2     7/2003  Towle et al.
6,667,248 B2    12/2003  M'Saad et al.
6,740,601 B2     5/2004  Tan et al.

\* cited by examiner

*Primary Examiner*—Carl Whitehead, Jr.
*Assistant Examiner*—Colleen E. Rodgers
(74) *Attorney, Agent, or Firm*—Horizon IP Pte Ltd

(57) ABSTRACT

An embodiment of the invention is a HDP CVD FSG layer and an HDP CVD SIN layer with more stability (e.g., less free F and less free H). A feature is that the FSG and SIN are formed using a HDP CVD process with a high plasma density between 1E12 and 1E15 ions/cc and more preferably between 1E14 and 1E15 ions/cc. The high bias has sufficient energy to break the F—Si bonds in the FSG. The high bias has sufficient energy to break the H—Si bonds in the silicon nitride. Whereby the FSG layer has less F and the SiN layer has less H that increases the FSG/SiN interface reliability. The embodiments can be used on smooth surfaces (non-gap fill applications).

18 Claims, 1 Drawing Sheet

HIGH DENSITY PLASMA AND BIAS RF POWER PROCESS TO MAKE STABLE FSG WITH LESS FREE F AND SIN WITH LESS H TO ENHANCE THE FSG/SIN INTEGRATION RELIABILITY

BACKGROUND OF INVENTION

1) Field of the Invention

The present invention relates to the manufacture of integrated circuits, and more specifically, to methods, apparatus and systems for forming fluorinated silicate glass ("FSG") films and silicon nitride (SiN) with improved characteristics in a high-density-plasma chemical-vapor-deposition ("HDP-CVD") environment.

2) Description of the Prior Art

In conventional integrated circuit fabrication, circuit elements are formed by etching a pattern of gaps in a layer of metal such as aluminum. The gaps are then filled with a dielectric such as silicon dioxide. Copper is poised to take over as the main on-chip conductor for all types of integrated circuits because of its lower resistance when compared to conventional aluminum alloys. Because it is difficult to etch copper, however, damascene processes have been developed for fabricating copper-based integrated circuits. In damascene processes, dielectric layers are deposited and then etched to form gaps that are subsequently filled with copper.

Fluorine-doped silicon oxide, also known as fluorosilicate glass, is an attractive solution to replace conventional silicon dioxide as intermetal dielectrics for damascene structures. FSG can be deposited in conventional HDP-CVD systems, which have been widely used for undoped silicate glass (USG) and FSG dielectrics in aluminum interconnects. FSG generally has a good process scheme in terms of reliability, stability, and throughput. Furthermore, the electrical performance of integrated circuits can be significantly improved due to the lower dielectric constant of FSG (3.4-3.7 compared to 4.1 for conventional silicon oxides). The lower dielectric constant reduces the capacitance between metal lines in the same layer and reduces cross talk across layers.

Unfortunately, the formation of FSG films raises other issues. First, blanket deposition of FSG films typically have a dielectric constant of about 3.7. It is desirable, in some instances, to further reduce this dielectric constant to improve device quality and performance.

Second, FSG layer integration problems have arisen as a result of the process recipe. Dielectric films used in damascene processes utilize a layer known as an etch stop to provide for selective etching of the film. Silicon nitride (Six Ny) is commonly used as an etch stop in damascene applications, for example when forming vias between layers containing metal lines. In the past, there have been problems in obtaining good adhesion between the silicon nitride and an underlying or overlying layer of FSG. Specifically, the FSG tends to outgas at temperatures of about 450 C. forming "bubbles" in an overlying $Si_xN_y$ layer. The bubbles lead to delamination of the $Si_xN_y$.

Previous attempts to improve the adhesion by, for example, reducing the fluorine content in the FSG merely postpone the delamination. Similarly, other problems arise when, in an attempt to reduce the hydrogen content in the FSG film, the hydrogen source is reduced (e.g., the amount of silane is reduced). In some cases, FSG deposition using $SiF_4$ without $SiH_4$ has a lower deposition rate than FSG deposition with both $SiF_4$ and $SiH_4$. Furthermore, $SiF_4$ tends to be destructive to ceramic components of the chamber. Using $SiH_4$ with the $SiF_4$ tends to mitigate the destructive effects of $SiF_4$. Hence, reductions in silane result in increased degradation of chamber components.

When FSG films are deposited on a silicon nitride barrier layer in damascene or dual damascene applications, failure to integrate the FSG with the barrier layers poses a significant obstacle in the widespread acceptance of FSG as an adequate low-k dielectric material.

Therefore, a need exists in the art for a method of depositing an FSG film with improved integration and stability. Further, a need exists to further lower the dielectric constant in the FSG film The relevant technical developments in the patent literature can be gleaned by considering the following.

U.S. Pat. No. 6,511,922 Krishnaraj et al.—shows HDPCVD FSG and SIN processes. Also see related patent U.S. Pat. No. 6,633,076B2(Krishnaraj et al.)

U.S. Pat. No. 6,740,601—T an, et al. May 25, 2004—HDP-CVD deposition process for filling high aspect ratio gaps.

U.S. Pat. No. 6,667,248—M'Saad, et al.—shows a fluorinated silicate glass layer is deposited onto the substrate using the high-density plasma.

U.S. Pat. No. 6,383,954—Wang, et al. May 7, 2002—Process gas distribution for forming stable fluorine-doped silicate glass and other films.

U.S. Pat. No. 6,323,119—Xi, et al. Nov. 27, 2001—CVD deposition method to improve adhesion of F-containing dielectric metal lines for VLSI application.

U.S. Pat. No. 6,489,230—Huang Dec. 3, 2002—Integration of low-k SiOF as inter-layer dielectric.

U.S. Pat. No. 6,593,650 (Towle et al. ) shows a HDP FSG process.

U.S. Pat. No. 6,468,927 (Zhang et al.) shows a HDPCVD FSG process with $N_2$ doping.

U.S. Pat. No. 6,303,518B1—Tain et al.—discusses HPD-CVD FSG processes.

SUMMARY OF THE INVENTION

The embodiments of the present invention provides a structure and a method of manufacturing a FSG and SiN layers to have improved reliability.

An example embodiment is a method of fabrication of a fluorosilicate glass layer adjacent to a silicon nitride layer in a semiconductor device. The embodiment comprises the following steps:

a) providing a semiconductor structure comprised of a substrate; said top surface of said semiconductor structure is essentially level;

b) forming a fluorosilicate glass layer using a High density Plasma deposition process with a high bias power over said semiconductor structure; said high bias has sufficient energy to break the F—Si bonds in the FSG;

c) forming a silicon nitride layer adjacent to said fluorosilicate glass layer using a High density Plasma deposition process with a high bias power; said high bias has sufficient energy to break the H—Si bonds in the silicon nitride;

Whereby the fluorosilicate glass layer has less F and the silicon nitride layer has less H that increases the FSG/SiN interface reliability because of the high bias power.

An embodiment of the invention is a HDP CVD FSG layer and an HDP CVD SIN layer with more stability (e.g., less free F and less free H). A feature is that the FSG and SIN use a high plasma density between 1E12 and 1E15 ions/cc.

The high bias has sufficient energy to break the F—Si bonds in the FSG. The high bias has sufficient energy to break the H—Si bonds in the silicon nitride. For example, a feature is that the bias power is between 2000 and 4000 Watts. The embodiments is preferably used on smooth surfaces (non-gap fill applications).

The above and below advantages and features are of representative embodiments only, and are not exhaustive and/or exclusive. They are presented only to assist in understanding the invention. It should be understood that they are not representative of all the inventions defined by the claims, to be considered limitations on the invention as defined by the claims, or limitations on equivalents to the claims. For instance, some of these advantages may be mutually contradictory, in that they cannot be simultaneously present in a single embodiment. Similarly, some advantages are applicable to one aspect of the invention, and inapplicable to others. Furthermore, certain aspects of the claimed invention have not been discussed herein. However, no inference should be drawn regarding those discussed herein relative to those not discussed herein other than for purposes of space and reducing repetition. Thus, this summary of features and advantages should not be considered dispositive in determining equivalence. Additional features and advantages of the invention will become apparent in the following description, from the drawings, and from the claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE EXAMPLE EMBODIMENTS

The example embodiments of the present invention will be described in detail with reference to the accompanying drawings. An example embodiment is a method of fabrication of a fluorosilicate glass layer adjacent to a silicon nitride layer in a semiconductor device.

II. Introduction

Fluorine exists in the FSG film in two states: 1) stable or single-bonded Fluorine: Si—F2) free Fluorine or unstable Fluorine: SiF2 or SiF3. The desirable FSG film is with more stable Fluorine and less free Fluorine. The stable Fluorine helps reduce the dielectric constant, and the free Fluorine tends to outdiffuse and is susceptible to moisture attack, causing film unstability and integration delamination issue. Some methods used to produce the stable FSG films includes 1) high temperature process, 2) use SiO2 cap at the end of FSG deposition to block the Fluorine outdiffusion; 3) doped with N2 proves better stability. In these approaches, the high temperature process is more effective but consume more SiF4 and are expensive processes.

SiN film interfaces with FSG film in the integration. The $H_2$ in the SiN determines the FSG/SiN interface stability because the free Fluorine tends to react with the H during integration thermal cycle, forming HF and resulting in bubbles, delamination and reliability issue.

To make FSG/SiN integration stable, we need to reduce free Fluorine in FSG and H in SiN films.

The embodiments of the invention reduce the free Fluorine in FSG and H in SiN films by using a high bias rf power. The high bias rf power has enough energy to break the F—Si bonds (in FSG) and the H—Si bonds (in SiN). It is thought that this reduces the free F and Free H because at lower temperature (400 C), the adatoms surface mobility and reaction energy are lower, which is not conducive to the dissociation. By adding the bias RF, it will increase the adatoms mobility and surface reaction energy, which will produce more stable single-bonded Si—F in the structure and less free Fluorine in the film.

III. Fluorine Silicate Glass (FSG) Layer and SiN Layers have Interface

In example embodiments of the invention the FSG and SiN layers are adjacent to each other and form a FSG/SiN interface. The FSG and SiN layers can be formed in any order. For example, the FSG layer can be over the SiN layer or vise versa.

Figure 1:
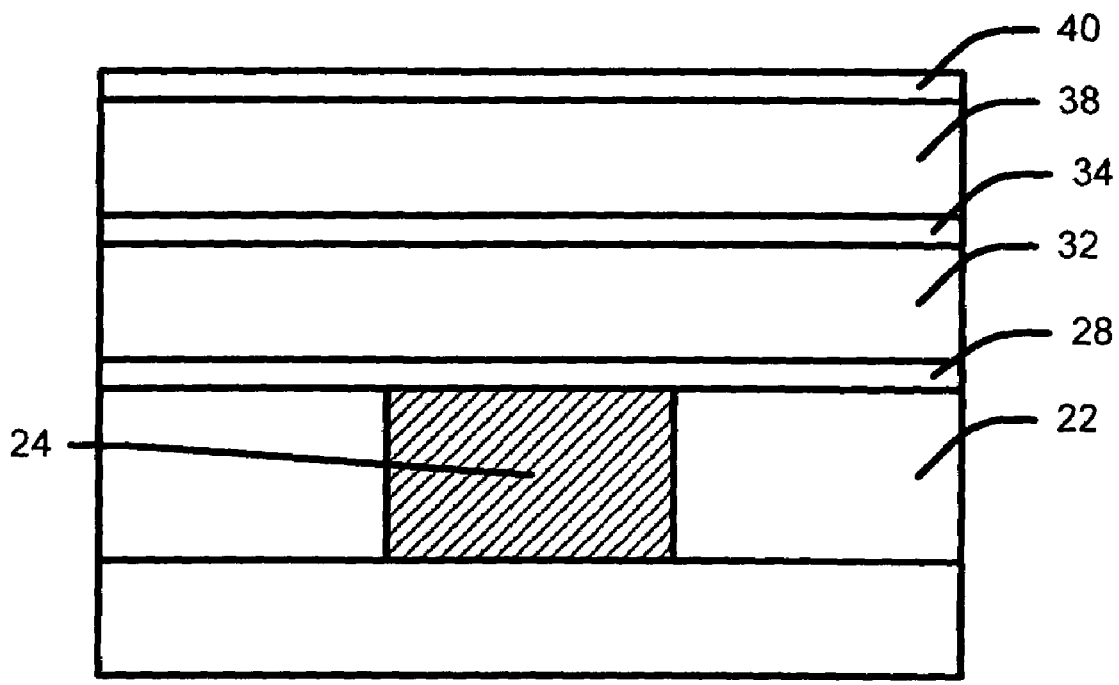
FIGS. 1 and 2 are cross sectional views for illustrating a method for manufacturing FSG/SiN interface according to an example embodiment of the present invention.

For example, FIG. 1 shows an example of an embodiments FSG and SiN layers. FIG. 1 shows a semiconductor structure 12 that can be comprised of a substrate having dielectric and conductive layer(s) there over. A first dielectric layer 22 and interconnect 24. The dielectric layer is 22 can be a FSG layer of an embodiment. Note, "First", "second", etc in the description is only part of a name and does not signifying any order or limitation.

First interconnect 24 can be a metal interconnect such as a copper interconnect.

A first cap layer 28 is formed over the interconnect 24 and the first dielectric layer 22. The first cap layer 28 is preferably comprised of SiN and preferably has a thickness between 300 and 500 Å.

A second dielectric layer 32 is preferably formed over the first cap layer 28. Preferably the surface that the second dielectric layer is formed over is about level surface (e.g., +/−300 angstroms topology) that is not a gap fill topography.

A second cap layer 34 is preferably formed over the second dielectric layer.

A third dielectric layer 38 is preferably formed over the second cap layer 34. Preferably the surface that the second dielectric layer is formed over is about level surface (e.g., +/−300 angstroms topology) that is not a gap fill topography.

A third cap layer 40 is preferably formed over the second dielectric layer 38.

Figure 2:
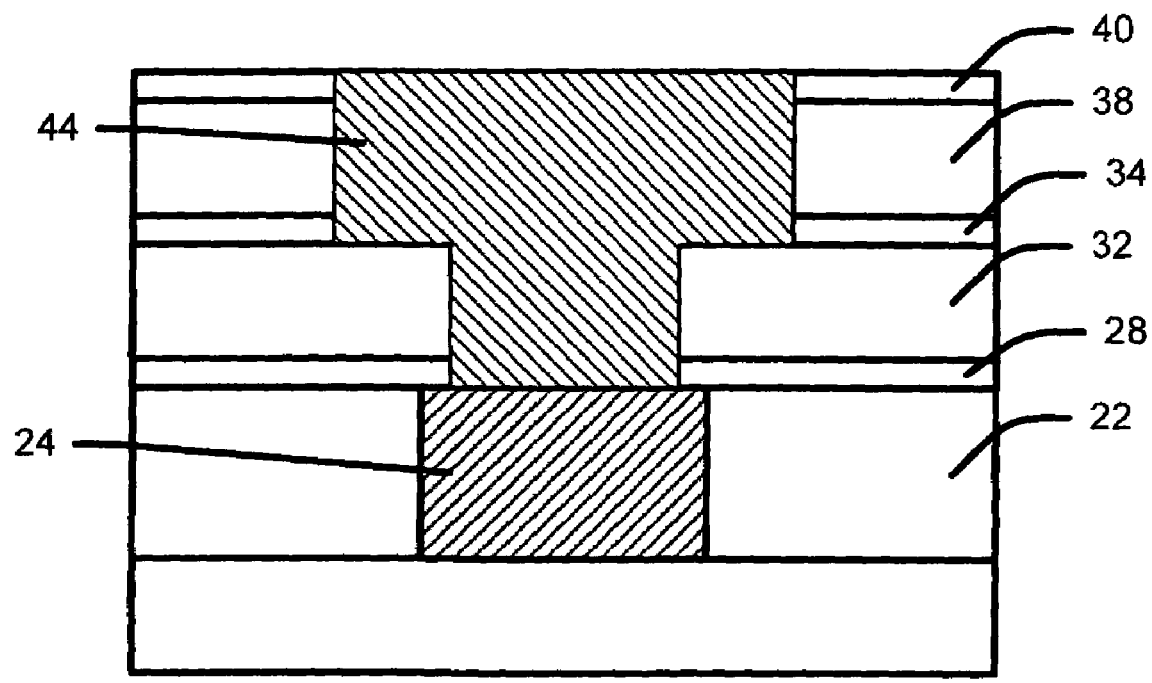

FIG. 2 shows an interconnect opening formed thru the layers 28 32 34 38 40 and exposing the interconnect 24.

FIG. 2 shows a damascene interconnect 44 formed thru the layers 28 32 34 38 40 and contacting the interconnect 24.

Any and/or all of the dielectric layers 22 32 38 can for the FSG layers of the embodiment. Any and/or all of the cap layers 28 34 40 can be the SiN layers of the embodiment.

IV. Processes to Form FSG Using a HDP Process with a High Bias

We preferably form a Fluorine silicate glass (FSG) layer over a semiconductor structure using a HDP process with a high bias. In an option, the FSG layer formed using a high density plasma deposition process with a plasma density between 1E12 and 1E15 and with a bias RF power with enough energy to break the Si—F bonds in the fluorosilicate glass (FSG). This reduces the free F in the FSG. It is thought that at lower temperature (400 C), the adatoms surface mobility and reaction energy are lower, which is not conducive to the dissociation. By adding the bias RF, it will increase the adatoms mobility and surface reaction energy, which will produce more stable single-bonded Si—F in the structure and less free Fluorine in the film.

In an option, the FSG layer formed using a high density plasma deposition process with a plasma density between 1E12 and 1E15 and more preferably between 1E14 and 1E15 and preferably above 1E14 ions/cc; and a bias between 2000 and 4000 W at a frequency of about 13.56 Mhz. The slow growth rate (preferably between 500 and 1500 Angstroms/min.) is controlled by adjusting the pressure, gas flow, and especially the bias RF.

In another example, the FSG layer formed using a high density plasma deposition process with: a plasma density between 1E12 and 1E15 and preferably above 1E14 ions/cc and a bias between 2000 and 4000 W at a frequency of 13.56 Mhz.; a flow ratio of $O_2$ to $SiH_4$ to SiF4 of 2 to 1 to 1 within plus/minus 10% limits; at a pressure between 1 to 4 torr; a temperature between 350 and 450 degree C.; in an ICP type reactor.

In another more detailed example, table A below shows preferred values and ranges for parameters.

TABLE A an example FSG process

| FSG Film | Setting | Range |
|---|---|---|
| oxygen | 140 sccm | 100–200 |
| $SiH_4$ | 70 sccm | 50–100 |
| SiF4 | 70 sccm | 40–100 |
| Top RF at a frequency of 2.0 MHZ) | 8000 W | 6000–10000 |
| Top RF - W/cm2 at a frequency of 2.0 MHZ) | 25.5 W/cm$^2$ | 19.1 to 31.8 W/cm$^2$ |
| Side RF at a frequency 2.0 MHZ | 8000 W at frequency of 2.00 Mhz | 6000–10000_at 2.0 Mhz |
| Side RF W/sq-cm at a frequency 2.0 MHZ | 25.5 W/cm$^2$ | 19.1 to 31.8 W/cm$^2$ |
| Bias RF (at frequency of 13.56 MHZ) | 3000 W | 2000–4000 W |
| Bias RF (W/sq-cm at frequency of 13.56 MHZ) | 9.55 W/sq-cm | 6.4–12.7 W/sq-cm |
| Pressure | 2 mTorr | 1–4 mTorr |
| Temperature | 400 C. | 350–450 |
| wafer Size | 200 mm Plasma ICP | |
| Plasma density - (ions/cc) | between 1E12 and 1E15 and preferably above or equal to 1E14 ions/cc | equal or above 1E14 |

** Note
The RF and bias powers were calculated in watts per unit area of wafer (for example ., 8000 W or = 8000/314 sq-cm of wafer area = 25.5 W/cm2 of wafer area).

The above process can be performed in a (ICP) inductive coupled plasma reactor by AMAT company, model number Ultima. Other examples of commercially available ICP reactors include Novellus by company and model speed.

The embodiment can by performed in a different types of HDP tools, such as a ECR.

Also, a parallel plate plasma chamber with top, side and bottom RF design can be used.

A. Non-gap Fill Applications

Note the embodiment's FSG and SIN process are performed on relatively smooth surface with minimal topography (not gap-fill applications). For example, a smoother surface is level or smooth (maximum bump or hole) within plus or minus 500 angstroms and more preferably plus minus 300 angstroms.

Embodiment's HPD FSG Film with Low Bias over Smooth (Non-gapfill Surface)

1) To obtain the single-bonded Si—F in the $SiO_2$ matrix, the SiF4 needs to be dissociated completely as much as possible in the plasma. Normal PECVD plasma density is only about $10^8$-$10^{11}$ ion/cm$^3$. To achieve this, high density plasma $10^{12}$-$10^{14}$ ion/cm$^3$ or above 1E14 ion/cm$^3$ will help a great deal to produce more stable and less free Fluorine in the film.
2) At lower temperature, the adatoms surface mobility and reaction energy are lower, which is not conducive to the dissociation. (Adatoms are atoms such as Si—F, Si—$F_2$, Si—$F_3$ Si—$F_6$, etc.). By adding the bias RF, it will increase the adatoms mobility and surface reaction energy, which will produce more stable and less free Fluorine in the film.
3) The low deposition rate is preferred so that the F has time to desorb or be removed by low energy ion bombardment V. SiN Layer We preferably form a silicon nitride (SiN) layer over a semiconductor structure using a HDP process with a high bias. In an option, the SiN layer is under or over the embodiment's FSG layer.

The SiN layer is preferably formed using a high density Plasma deposition process plasma density between about a 1E12-1E15 ions/cc and preferably above 1E14 ions/cc and a high bias between 2000 and 4000 W at a frequency of 13.56 Mhz; a $SiH_4$ to $N_2$ flow ratio between 1:0.005 to 0.03:1; at a bias between 2000 and 4000 Watts; at a pressure between 1 and 4 torr; at a temperature between 350 and 450 degrees C.

The surface that the SiN layer is formed over can be smooth non-gap fill surface as described above for the FSG layer.

The table below shows a preferred process.

TABLE b

Example SiN HDP process

| SiN Film | Setting | Range |
|---|---|---|
| $SiH_4$ | 40 sccm | 20–60 |
| $N_2$ | 3000 sccm | 2000–4000 |
| Ar | 150 sccm | 100–200 |
| Top RF (frequency 2.0 MHz) | 8000 W | 6000–10000 |
| Top RF - W/cm2 at a frequency of 2.0 MHZ) | 25.5 W/cm$^2$ | 19.1 to 31.8 W/cm$^2$ |
| Side RF (frequency 2.0 MHz) | 8000 W | 6000–10000 |
| Side RF W/sq-cm at a frequency of 2.0 MHZ | 25.5 W/cm$^2$ | 19.1 to 31.8 W/cm$^2$ |
| Bias RF (frequency 2.0 MHZ) | 3000 W | 2000–4000 |
| Bias RF (W/sq-cm at frequency of 13.56 MHZ) | 9.55 W/sq-cm | 6.4–12.7 W/sq-cm |
| Pressure | 2 mTorr | 1–4 |
| Temperature | 400 C. | 350–450 |
| wafer Size | 200 mm Plasma ICP | |
| Plasma density - (ions/cc) | 1E14 or above | E12–1E15 and preferably 1E14 or above |

** Note
The RF and bias powers were calculated in watts per unit area of wafer (for example, 8000 W or = 8000/314 sq-cm of wafer area = 25.5 W/cm2 of wafer area).

The above process can be performed in a (ICP) inductive coupled plasma reactor by AMAT company, model number Ultima. Other examples of commercially available ICP reactors include Novellus by company and model speed.

The embodiment can by performed in a different types of HDP tools, such as a ECR.

Also, a parallel plate plasma chamber with top, side and bottom RF design can be used.

EMBODIMENT'S SiN FILM

1) To obtain SiN film with less H2 contamination, the SiH4 needs to be dissociated completely as much as possible in the plasma. Normal PECVD plasma density is only about $10^8$-$10^{11}$ ion/cm$^3$. To achieve this, high density plasma $10^{12}$-$10^{14}$ ion/cm$^3$ will help a great deal.
2) It is known that SiN grown at high temperature contains less $H_2$. At lower temperature, the adatoms surface mobility and reaction energy are lower, which is not conducive to the dissociation. By adding the bias RF, it will increase the adatoms mobility and surface reaction energy. The bombardment will help to clean those loose bonded contaminants.
3) The low deposition rate is preferred so that the H has time to desorb or be removed by low energy ion bombardment.

FSG/SiN Integration
1) The stable FSG film with less F and SiN with less H can be made by using high density plasma and bias RF power process.

The FSG/SiN interface reliability can be enhanced.

A. NON-LIMITING EMBODIMENTS

In the above description numerous specific details are set forth such as flow rates, pressure settings, thicknesses, etc., in order to provide a more thorough understanding of the present invention. It will be obvious, however, to one skilled in the art that the present invention may be practiced without these details. In other instances, well known process have not been described in detail in order to not unnecessarily obscure the present invention. Also, the flow rates in the specification can be scaled up or down keeping the same molar % or ratios to accommodate different sized reactors as is known to those skilled in the art. Also, the powers can be scaled up or down depending on the reactor sizes and configurations.

Unless explicitly stated otherwise, each numerical value and range should be interpreted as being approximate as if the word about or approximately preceded the value of the value or range.

Given the variety of embodiments of the present invention just described, the above description and illustrations show not be taken as limiting the scope of the present invention defined by the claims.

While the invention has been particularly shown and described with reference to the preferred embodiments thereof, it will be understood by those skilled in the art that various changes in form and details may be made without departing from the spirit and scope of the invention. It is intended to cover various modifications and similar arrangements and procedures, and the scope of the appended claims therefore should be accorded the broadest interpretation so as to encompass all such modifications and similar arrangements and procedures.

What is claimed is:

1. A method of fabrication of a fluorosilicate glass layer adjacent to a silicon nitride layer in a semiconductor device comprising the steps of:
    a) providing a semiconductor structure comprised of a substrate;
    b) forming a fluorosilicate glass layer using a high density plasma deposition process with a high bias power over said semiconductor structure; said high bias power has sufficient energy to break F—Si bonds in the fluorosilicate glass layer; and
    c) forming a silicon nitride layer adjacent to said fluorosilicate glass layer using a high density plasma deposition process with a high bias power; said high bias power has sufficient energy to break H—Si bonds in the silicon nitride layer.

2. The method of claim 1 wherein said fluorosilicate glass layer is on and in contact with said silicon nitride layer or said silicon nitride layer is on and in contact with said fluorosilicate glass layer; a top surface of said semiconductor structure is about relatively smooth within plus or minus 500 angstroms.

3. The method of claim 1 which further includes forming an interconnect opening in said fluorosilicate glass layer and said silicon nitride layer; and forming a copper interconnect in said interconnect opening.

4. The method of claim 1 wherein said fluorosilicate glass layer is formed using a high density plasma deposition process with a plasma density between 1E12 and 1E15 ions/cc and a bias power between 2000 and 4000 W at a frequency of 13.56.Mhz; and said bias power has sufficient energy to break F—Si bonds in the fluorosilicate glass layer and to reduce the free F in the fluorosilicate glass layer; a surface that said fluorosilicate glass layer is formed on and in contact with is about smooth;
    said silicon nitride layer is formed using a high density plasma deposition process with a plasma density between about 1E14 and 1E15 ions/cc and a SiN bias power between 6.4 and 12.7 W/sq-cm at a frequency of 13.56 Mhz; the SiN bias power has sufficient energy to break the H—Si bonds in the silicon nitride and to reduce the free H in the silicon nitride layer.

5. The method of claim 1 wherein said fluorosilicate glass layer is formed using a high density plasma deposition process with a plasma density between 1E12 and 1E15 ions/cc and a bias power between 6.4 and 12.7 W/sq-cm at a frequency of 13.56.Mhz: and said bias power has sufficient energy to break F—Si bonds in the fluorosilicate glass layer and to reduce the free F in the fluorosilicate glass layer; a surface that said fluorosilicate glass layer is formed on and in contact with is about smooth within plus or minus 500 angstroms.

6. The method of claim 1 wherein said fluorosilicate glass layer is formed using a high density plasma deposition process with a plasma density between 1E14 and 1E15 ions/cc, and a bias power between 2000 and 4000 W at a frequency of 13.56 Mhz.

7. The method of claim 1 wherein said fluorosilicate glass layer is formed using a high density plasma deposition process with a plasma density between 1E14 and 1E15 ions/cc and a bias between 2000 and 4000 W at a frequency of 2 Mhz, a flow ratio of $O_2$ to $SiH_4$ to $SiF4$ of 2 to 1 to 1 within plus/minus 10% limits; at a pressure between 1 to 4 torr; a temperature between 350 and 450 degree C.; in a ICP type reactor.

8. The method of claim 1 wherein said silicon nitride layer is formed using a high density Plasma deposition process with a plasma density between about 1E12 and 1E15 ions/cc and a bias between 6.4 and 12.7 W/sq-cm at a frequency of 13.56 Mhz.

9. The method of claim 1 wherein said silicon nitride layer is formed using a high density Plasma deposition process with a plasma density between about 1E14 and 1E15 ions/cc and a bias between 6.4 and 12.7 W/sq-cm at a frequency of 13.56 Mhz.

10. The method of claim 1 wherein said silicon nitride layer is formed using a high density Plasma deposition process with a plasma density between about a 1E12 and 1E15 ions/cc and a high bias between 2000 and 4000 W at a frequency of 2.0 Mhz; a $SiH_4$ to $N_2$ flow ratio between 1:0.005 to 0.03:1; at a bias between 2000 and 4000 Watts; at a pressure between 1 and 4 torr; at a temperature between 350 and 450 degrees C.

11. A method of fabrication of a fluorosilicate glass layer adjacent to a silicon nitride layer in a semiconductor device comprising the steps of:
   a) providing a semiconductor structure comprised of a substrate;
      a top surface of said semiconductor structure is relatively smooth;
   b) forming a fluorosilicate glass layer using a High density Plasma deposition process with a high bias power over said semiconductor structure; said high bias power has sufficient energy to break the F—Si bonds in the fluorosilicate glass layer and to reduce the free F in the fluorosilicate glass layer;
      (1) said fluorosilicate glass layer is formed using a high density plasma deposition process with a plasma density of 1E14 ions/cc and above and a bias between 6.4 and 12.7 W/sq-cm at a frequency of 13.56. Mhz;
   c) forming a silicon nitride layer adjacent to said fluorosilicate glass layer using a High density Plasma deposition process with a high bias power; said high bias power has sufficient energy to break the H—Si bonds in the silicon nitride and to reduce the free H in the silicon nitride layer;
      (1) said silicon nitride layer is formed using a high density Plasma deposition process plasma density between about 1E14 and 1E15 ions/cc and a bias between 6.4 and 12.7 W/sq-cm at a frequency of 13.56 Mhz;
   whereby the fluorosilicate glass layer has less free F and the silicon nitride layer has less free H that increases the FSG/SiN interface reliability.

12. The method of claim 11 which further includes forming an interconnect opening in said fluorosilicate glass layer and said silicon nitride layer; and forming a copper interconnect in said interconnect opening.

13. The method of claim 11 wherein
   (1) said fluorosilicate glass layer is formed using a high density plasma deposition process with a plasma density between 1E14 and 1E15 ions/cc and a bias between 2000 and 4000 W at a frequency of 2 Mhz, a flow ratio of $O_2$ to $SiH_4$ to SiF4 of 2 to 1 to 1 within plus/minus 10% limits; at a pressure between 1 to 4 torr; a temperature between 350 and 450 degree C.; in a ICP type reactor; and
   (2) said silicon nitride layer is formed using a high density Plasma deposition process plasma density between about a 1E14 and 1E15 ions/cc and a high bias between 2000 and 4000 W at a frequency of 2.0 Mhz; a $SiH_4$ to $N_2$ flow ratio between 1:0.005 to 0.03:1; at a pressure between 1 and 4 torr; at a temperature between 350 and 450 degrees C.

14. A method of fabrication of a fluorosilicate glass layer adjacent to a silicon nitride layer in a semiconductor device comprising the steps of:
   (a) providing a semiconductor structure comprised of a substrate, a first dielectric layer and a lower interconnect; said first dielectric layer and said lower interconnect over said substrate; said top surface of said first dielectric layer and said lower interconnect is relatively smooth;
   (b) forming a first silicon nitride layer over and adjacent to said first dielectric layer using a High density Plasma deposition process with a high bias power; said high bias power has sufficient energy to break the H—Si bonds in the first silicon nitride layer and to reduce the free H in said first silicon nitride layer;
   c) forming a first fluorosilicate glass layer using a High density Plasma deposition process with a high bias power over said first silicon nitride layer; said high bias power has sufficient energy to break the F—Si bonds in the FSG and to reduce the free F in the fluorosilicate glass layer;
   d) forming a second silicon nitride layer adjacent to said first fluorosilicate glass layer using a High density Plasma deposition process with a high bias power; said high bias has sufficient energy to break the H—Si bonds in the second silicon nitride layer;
   e) forming a second fluorosilicate glass layer using a High density Plasma deposition process with a high bias power over said second silicon nitride layer; said high bias power has sufficient energy to break the F—Si bonds in the FSG and to reduce the free F in the fluorosilicate glass layer;
   f) forming a third silicon nitride layer adjacent to and over said second fluorosilicate glass layer using a High density Plasma deposition process with a high bias power; said high bias has sufficient energy to break the H—Si bonds in the third silicon nitride layer;
   g) forming an interconnect opening in said first silicon nitride layer, said first fluorosilicate glass layer, said second silicon nitride layer, said second fluorosilicate glass layer and said third silicon nitride layer;
   h) forming a copper interconnect in said interconnect opening; said copper interconnect formed using a damascene process;
   whereby the first and second fluorosilicate glass layers have less F and the first, second and third silicon nitride layers have less H that increases the FSG/SiN interface reliability.

15. The method of claim 14 wherein the first and second fluorosilicate glass layers are formed using a high density plasma deposition process with a plasma density between 1E12 and 1E15 ions/cc and a bias power between 2000 and 4000 W at a frequency of 13.56. Mhz.

16. The method of claim 14 which said first, second and third silicon nitride layer are formed using a high density Plasma deposition process plasma density between about 1E14 and 1E15 ions/cc and a bias between 2000 and 4000 W at a frequency of 13.56 Mhz.

17. The method of claim 14 wherein:
   (1) said fluorosilicate glass layer is formed using a high density plasma deposition process with a plasma density between 1E14 and 1E15 ions/cc and a bias between 6.4 and 12.7 W/sq-cm at a frequency of 2 Mhz, a flow ratio of $O_2$ to $SiH_4$ to SiF4 of 2 to 1 to 1 within plus/minus 10% limits; at a pressure between 1 to 4 torr; a temperature between 350 and 450 degree C.; in a ICP type reactor; and (2) said silicon nitride layer is formed using a high density Plasma deposition process with a plasma density between about a 1E14 and 1E15 ions/cc and a high bias between 6.4 and 12.7 W/ cm$^2$ at a frequency of 2.0 Mhz; a SiH$_4$ to N$_2$ flow ratio between 1:0.005 to 0.03:1; at a bias between 6.4 and 12.7 W/sq-cm; at a pressure between 1 and 4 torr; at a temperature between 350 and 450 degrees C.

18. The method of claim 1 which further comprises:

forming said silicon nitride layer over said semiconductor structure;

forming said fluorosilicate glass layer over said silicon nitride layer;

forming a first silicon nitride layer over said fluorosilicate glass layer using a high density plasma deposition process with a high bias power; said high bias power has sufficient energy to break H—Si bonds in the first silicon nitride layer and to reduce free H in the first silicon nitride layer;

forming a first fluorosilicate glass layer over said first silicon nitride layer using a high density plasma deposition process with a high bias power; said high bias power has sufficient energy to break F—Si bonds in the first fluorosilicate glass layer and to reduce free F in the first fluorosilicate glass layer;

forming a second silicon nitride layer over said first fluorosilicate glass layer using a high density plasma deposition process with a high bias power; said high bias power has sufficient energy to break H—Si bonds in the second silicon nitride layer and to reduce free H in said second silicon nitride layer;

forming an interconnect opening in said silicon nitride layer, said fluorosilicate glass layer, said first silicon nitride layer, said first fluorosilicate glass layer and said second silicon nitride layer; and forming a copper interconnect in said interconnect opening;

wherein the fluorosilicate glass layer and the first fluorosilicate glass layer have reduced free F;

and the silicon nitride layer, the first silicon nitride layer and the second silicon nitride layer have less free H that increases FSG/SiN interfaces reliability;

wherein surfaces that said silicon nitride layer, said fluorosilicate glass layer, said first silicon nitride layer, said first fluorosilicate glass layer, and said second silicon nitride layer, are formed on and in contact with, are about smooth within plus or minus 500 angstroms.

* * * * *